(12) United States Patent
Werner

(10) Patent No.: US 7,898,243 B2
(45) Date of Patent: Mar. 1, 2011

(54) DEVICE FOR DETERMINING THE STRENGTH OF THE MAGNETIC FIELD OF AN ELECTROMAGNET

(75) Inventor: Matthias Werner, Hamburg (DE)

(73) Assignee: Deutsches Elektronen-Synchrotron, Hamburg (DE)

( * ) Notice: Subject to any disclaimer, the term of this patent is extended or adjusted under 35 U.S.C. 154(b) by 332 days.

(21) Appl. No.: 12/067,631

(22) PCT Filed: Sep. 11, 2006

(86) PCT No.: PCT/EP2006/008823
§ 371 (c)(1),
(2), (4) Date: Jul. 21, 2008

(87) PCT Pub. No.: WO2007/036296
PCT Pub. Date: Apr. 5, 2007

(65) Prior Publication Data
US 2009/0102459 A1    Apr. 23, 2009

(30) Foreign Application Priority Data
Sep. 23, 2005 (DE) .......................... 10 2005 045 537

(51) Int. Cl.
*G01R 33/02* (2006.01)
*G01B 7/14* (2006.01)
(52) U.S. Cl. .................................. 324/207.22; 324/260
(58) Field of Classification Search ............. 324/207.22, 324/260
See application file for complete search history.

(56) References Cited

U.S. PATENT DOCUMENTS
5,668,470 A    9/1997    Shelor

FOREIGN PATENT DOCUMENTS
DE    2916289 B1    5/1980
EP    0257371 A2    3/1988
WO    2005052605 A1    6/2005

*Primary Examiner* — Reena Aurora
(74) *Attorney, Agent, or Firm* — Hovey Williams LLP

(57) ABSTRACT

A device and a method for determining the magnetic field strength of an electromagnet is illustrated and described. The object to provide a device and a method for determining the strength of the field of an electromagnet, which allows even minor changes in the magnetic field to be determined quickly is achieved in terms of an apparatus by a device having a measurement device for determining the magnetic field of the electromagnet, a low-pass filter element which is connected to the first supply line and to the second supply line and is adapted to emit a signal at the output of the low-pass filter element from the voltage between the first supply line and the second supply line, which signal approximates to the time profile of the magnetic field strength in the electromagnet, having a low-pass filter downstream from the measurement device, having a high-pass filter connected in series with the low-pass filter element, and having a signal output, wherein the output of the measurement device and the output of the low-pass filter element are connected to the signal output.

20 Claims, 6 Drawing Sheets

DEVICE FOR DETERMINING THE STRENGTH OF THE MAGNETIC FIELD OF AN ELECTROMAGNET

CROSS-REFERENCE TO RELATED APPLICATION

Figure 1:
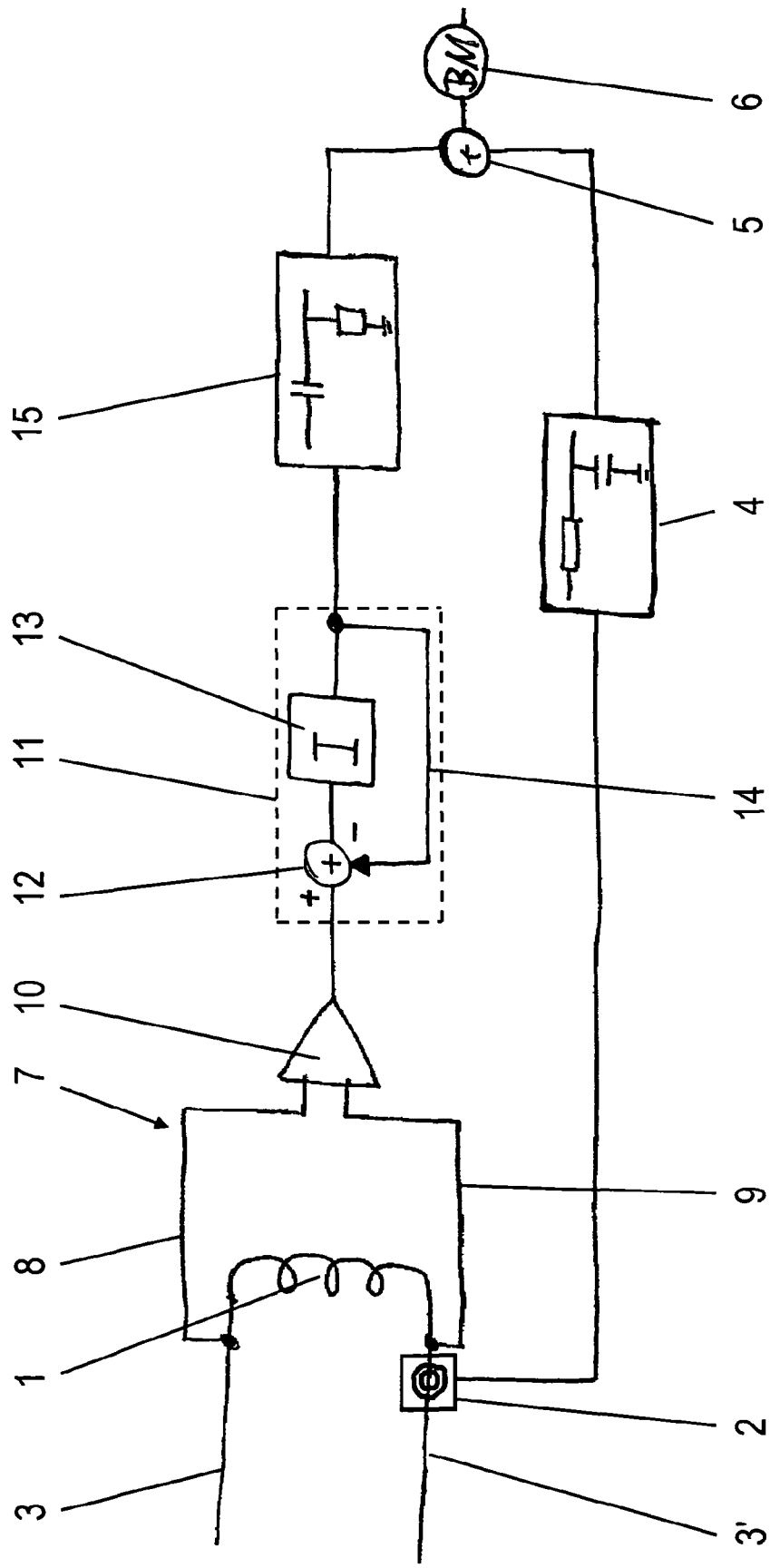

This is a National Phase Application pursuant to 37 C.F.R. §371 of International Application No. PCT/EP2006/008823, filed Sep. 11, 2006, claiming priority from German Application No. DE 10 2005 045 537.9, filed Sep. 23, 2005, the entire disclosures of both of which are hereby incorporated by reference herein.

BACKGROUND OF THE INVENTION

1. Field of the Invention

The present invention relates to a device and a method for determining the magnetic field strength of an electromagnet.

2. Discussion of the Prior Art

The strength of the magnetic field of an electromagnet can be determined by measuring the current flowing through the magnet, since this current is a direct measure of the magnetic field that is produced, although this is corrupted in a magnet with an iron core inter alia by hysteresis and saturation effects. In electromagnets which are used in accelerator installations, very high currents frequently occur, so that the magnetic field which occurs around a supply line is used for measurement. So-called direct-current current transformers (DCCTs) are known for this purpose from the prior art, as disclosed by way of example in WO 2005/052605. Alternatively, it is also possible to measure the magnetic field in the magnet directly with the aid of a Hall probe.

However, measurement devices such as these have the disadvantage that changes which occur in the current and/or the magnetic field become evident in the output signal only after a comparatively long time. It is therefore frequently not possible to react sufficiently quickly to changes in the magnetic field. This is particularly relevant in the case of magnets for accelerator installations since in this case even small discrepancies between the magnetic field strength and the nominal value lead to deflection or defocusing of the beam, and are therefore associated with the beam striking elements of the beam line. The latter in turn results in gamma and neutron radiation being produced, so that the area around the accelerator is subject to an increased radiation load. Furthermore, the beam line elements may be damaged. In order to avoid such radiation loads and damage, it is therefore of particular interest to detect even minor changes in the magnetic field as quickly as possible.

This problem of the known magnetic field measurement devices is associated with the peak value, defined with respect to a reasonable measurement time, of the sum of the noise and disturbance signals in the output signal in the frequency range up to 10 kHz being about $10^{-4}$ with respect to full deflection. The disturbance signals may in this case, for example, be created by switching heavy loads in the surrounding area, adjacent power electronics or interference spikes on the supply network. However, a peak value such as this during operation of acceleration installations is excessive since limit values must be set there such that the accelerator is switched off if these limit values are exceeded just once, with these limit values being in the order of magnitude of the peak values above. Otherwise, there can be no assurance that defocusing and unacceptable deflection will not occur.

SUMMARY

Against the background of the prior art, the present invention is therefore based on the object of providing a device and a method for determining the strength of the field of an electromagnet, which allows even minor changes in the magnetic field to be determined quickly.

This object is achieved by a device having a measurement device for determining the magnetic field of the electromagnet, a low-pass filter element which is connected to the first supply line and to the second supply line and is adapted to emit a signal at the output of the low-pass filter element from the voltage between the first supply line and the second supply line, which signal approximates to the time profile of the magnetic field strength in the electromagnet, having a low-pass filter downstream from the measurement device, having a high-pass filter connected in series with the low-pass filter element, and having a signal output, wherein the output of the measurement device and the output of the low-pass filter element are connected to the signal output.

In the following text, the expression the "magnetic field strength" of an electromagnet is used to mean the strength of the magnetic field in the area that is being used, that is to say for example in the air gap between pole shoes.

According to the invention, the device has two branches, both of which lead to the signal output. The first branch comprises the measurement device for determining the magnetic field, which measurement device emits a first signal whose magnitude is a measure of the magnetic field strength. The second branch of the device comprises a low-pass filter element, which records the voltage dropped across the magnet. The time profile of the voltage signal tapped off is changed by the low-pass filter element such that it corresponds approximately to that of the magnetic field strength in the magnet. The low-pass filter element is accordingly used to "simulate" the time profile of the magnetic field strength originating from the voltage signal. The simulation is based on the voltage induced in a coil corresponding to the derivative with respect to time of the magnetic field.

The invention also makes use of the fact that the relationship between the magnetic field strength of a magnet and the applied voltage can be approximated by a first-order low-pass filter, and that the voltage signal at the output of the low-pass filter element has a profile which is approximated to the time profile of the field in an electromagnet.

Furthermore, the measurement device has a low-pass filter downstream from it, such that high-frequency components are filtered out of the emitted voltage signal and are not included in the output signal at the signal output. A high-pass filter is provided in the second branch, is connected downstream from the low-pass filter element and is used to pass only the high-frequency components, which are associated with "rapid" changes such as step functions, to the signal output. The low-pass filter is matched to the high-pass filter that is provided in the second branch such that components at a frequency which can pass through the high-pass filter could no longer pass through the low-pass filter in the first branch. In particular, the filter curves are matched to one another such that they are complementary to one another. This means that the sum of the two filter transfer functions is constant over the entire frequency range of interest. This can be achieved particularly easily by using a first-order low-pass filter and a first-order high-pass filter, with the two having the same cut-off frequency. In addition, the two branches must be matched to one another by appropriate frequency-independent gain factors.

The low-pass filter and the high-pass filter result in the low-frequency components of the output signal that is produced at the signal output originating from the first branch. In contrast, the high-frequency components of the output signal which is emitted at the signal output pass through the second branch. The output signal therefore contains the entire frequency spectrum of the magnetic field—in the low-frequency range with the good stability and accuracy of the first branch, and in the higher-frequency range with the reduced noise of the first branch.

The peak value of the noise in the output signal at the signal output in a device according to the invention is in the range from $10^{-5}$ to $10^{-6}$ with respect to full deflection, and is therefore reduced by at least one order of magnitude in comparison to the prior art. In comparison to a device in which the magnetic field is determined only directly, this allows minor changes in the magnetic field strength to be determined more quickly. For example, magnets in accelerator installations can therefore be readjusted at an early stage or the beam can be stopped before it results in complete defocusing and/or unacceptably large deflections and, associated with this, the beam striking beam line elements in an uncontrolled manner.

In one preferred embodiment, the functional configuration of the low-pass filter element comprises a low-pass filter element adder with a first input, a second input and an output, a low-pass filter element integrator which is connected to the output of the low-pass filter element adder, and a feedback connection, wherein the first input of the low-pass filter element adder forms the input of the low-pass filter element, wherein the output of the low-pass filter element integrator forms the output of the low-pass filter element, and wherein the feedback connection connects the output of the low-pass filter element integrator to the second input of the low-pass filter element adder. On the one hand, this makes use of the fact that the current/voltage behavior of a magnet can also be simulated by combination of an integrator with negative feedback, with the output signal from the integrator being subtracted from the input signal at the low-pass filter element adder. In order to match this exemplary embodiment of a low-pass filter element to a predetermined electromagnet, all that is required is to appropriately select the time constant of the integrator which defines the rise in the output signal as a function of time. A configuration such as this is provided by a first-order low-pass filter.

This preferred embodiment can be implemented in such a way that the low-pass filter element is in the form of a low-pass filter comprising a resistor and a capacitor, with the cut-off frequency $\omega_G$ of the low-pass filter being matched to the inductance L and the resistance R of the magnet.

Alternatively, the above preferred embodiment can also be implemented by the low-pass filter element having a first resistor, an operational amplifier, a capacitor, and a second resistor, wherein the first resistor is connected to the inverting input of the operational amplifier, wherein the capacitor is connected in parallel with the inverting input and the output of the operational amplifier, and wherein the second resistor is connected in parallel with the capacitor and the inverting input and the output of the operational amplifier. A circuit such as this is likewise provided by a first-order low-pass filter.

In a further preferred manner, a temperature calculation circuit is provided in order to take account of temperature changes in the magnet. This makes it possible to correct the magnetic field strength signal as determined by the low-pass filter element on the basis of the recorded magnet voltage, as appropriate for the thermally dependent resistance change in the magnet. In particular, this means that an increase in the magnet voltage caused just by a resistance change does not lead to a change in the magnetic field strength emitted at the signal output.

The temperature calculation circuit which is connected downstream from the low-pass filter element can be implemented in a preferred manner by having a squaring element, a feedback adder which is connected via its first input to the output of the squaring element, an integrator whose input is connected to the output of the feedback adder, a feedback line which connects the output of the integrator to the second input of the feedback adder, a resistance adder which has a first input, a second input which is connected to the output of the integrator, and an output, and a resistance source, which passes a voltage signal to the second input of the resistance adder, wherein a multiplier is provided in the feedback connection of the low-pass filter element, and wherein the output of the resistance adder is connected to the multiplier.

In this case, all that is required for operation of the temperature calculation circuit is that the ratio of the output signal from the squaring element to the input signal follows a square law. This means that a linear component can also be used as a "squaring element" in the situation where only pulses at a fixed magnitude are applied to the magnet.

The integrator which is fed from the current level signal, squared by the squaring element, from the low-pass filter element simulates the increase in the resistance resulting from heating of the magnet, on the assumption that the heating is proportional to the consumed power and is therefore proportional to the square of the current. In order finally to obtain a signal which is proportional to the total resistance of the magnet, the resistance source adds to the resistance adder an additional signal relating to the output signal from the integrator and corresponding to the resistance of the magnet at the environmental temperature.

Any cooling of the magnet, for example resulting from convection, is also taken into account by the temperature calculation circuit having a feedback adder, which is connected via its first input to the output of the squaring element and via its output to the input of the integrator, and a feedback line, with the feedback line connecting the output of the integrator to the second input of the feedback adder. Negative feedback via the feedback line in this case takes account of the fact that the temperature rise as the temperature increases is always less as a result of cooling, since the heat emitted is proportional to the temperature difference between the magnet and the environment.

The output signal from the temperature calculation circuit is a measure of the total resistance of the magnet and is multiplied by the output signal from the low-pass filter element integrator, that is to say the approximated magnet current in order in this way to obtain a measure of the voltage drop resulting from the resistance, and this is then subtracted from the total magnet voltage at the low-pass filter element adder. After this subtraction, the integrator is therefore supplied with only that portion of the magnet voltage which is caused by the inductance and the magnetic field change. The output of the low-pass filter element is therefore independent of the current-dependent heating.

It is also preferable for the low-pass filter element to have a converter connected downstream from it, which is adapted to convert the second signal which is emitted from the low-pass filter element and approximates to the magnetic field strength and the magnet current, to a magnetic field strength signal with better accuracy. The converter makes it possible to take into account saturation effects in the magnet, in the event of which an increase in the current results in only a minor increase in the magnetic field.

This consideration of saturation effects can be achieved by using the converter to store a table which contains the magnetic field strength signals relating to simulated current level signals from the low-pass filter element. Furthermore, the converter makes it possible to include hysteresis effects in the conversion of the current level signal to a magnetic field strength signal.

In this case, it is also preferable for the converter to have a derivative output which produces a signal which is proportional to the reciprocal of the derivative of the magnetic field strength in the electromagnet as a function of the current, with a multiplier being provided between the low-pass filter element adder and the low-pass filter element integrator, its first input is connected to the low-pass filter element adder and its output is connected to the low-pass filter element integrator, and with the derivative output being connected to the second input of the multiplier.

This makes it possible to additionally take account of saturation effects relating to the change in the magnetic field strength as a function of the change in the magnet voltage. The change in the inductance which results from saturation effects is then already included in the incoming magnet voltage signal.

The adders, multipliers, integrators, low-pass filters, high-pass filters and operational amplifiers mentioned in the embodiments described above are conventional electrical components or assemblies which do not need special adaptation to implement the invention and which are known to a person skilled in the art in the field of the prior art. All that may be necessary is to choose certain parameters such as time constants, for example, as a function of the parameters of the electromagnet.

In a first alternative, the magnetic field can be measured directly by the measurement device in order to determine it, so that the measurement device is in the form of a magnetic field strength measurement device. In this case, in particular, the measurement device may be in the form of a Hall probe located in the magnet air gap. In a second alternative, the measurement device is a magnet current measurement device, in which case it is preferable to use a DCCT or a magnetic field sensor which measures the magnetic field surrounding the supply line. In this second alternative, the magnetic field is therefore not measured directly in the magnet and, instead, the magnetic field strength is determined from the measured current.

The above object is also achieved by a method in which a first signal is recorded whose magnitude is a direct measure of the magnetic field strength of the electromagnet, in which the voltage dropped across the electromagnet is recorded, in which a second signal is produced from the recorded voltage, with the recorded voltage being low-pass filtered, such that the time profile of the second signal is approximated to that of the magnetic field strength in the electromagnet, in which the first signal and the second signal are combined to form an output signal, and in which the first signal and the second signal are filtered such that only low-frequency components of the first signal and only high-frequency components of the second signal are included in the output signal.

According to the invention, two signals are recorded, and are then combined to form an output signal. The first signal is produced by recording the strength of the magnetic field, which can be done directly or by recording the magnet current. The second signal is determined from the voltage dropped across the magnet, with the tapped-off voltage signal being low-pass filtered such that its time profile corresponds to the magnetic field strength in the magnet. The determination process is accordingly used to "simulate" the time profile of the magnet current or of the magnetic field resulting from the voltage signal, with the second signal then being a measure of the magnetic field strength, with a reduced noise level in comparison to the first signal. Any change in the magnetic field can therefore be determined more quickly by means of the second signal since, in particular, even small changes represent a significant discrepancy in comparison to the noise, at an earlier stage.

In order to ensure that the second signal is included in the output signal essentially only when rapid changes occur in the magnetic field strength, the first signal and the second signal are filtered such that only low-frequency components of the first signal and only high-frequency components of the second signal are included in the output signal.

In order to produce the second signal, it is preferable for the signal from the recorded voltage to be integrated over time and for the integrated signal then to form the second signal, with the second signal being subtracted from the recorded voltage before integration. Processing of the signal from the recorded voltage such as this with negative feedback makes it possible to simulate the time profile of the magnetic field strength in the electromagnet on the basis of the recorded magnet voltage, in a simple form. In a further preferred manner, the described method of operation can be provided by a low-pass filter.

It is also preferable, for production of the second signal, to take account of the temperature increase of the electromagnet in order in this way to further improve the simulation accuracy. Finally, in a further preferred manner, the second signal can be converted to a signal proportional to the magnetic field strength, but with better accuracy. In this case, the simulation can also include saturation and hysteresis effects in the magnet.

BRIEF DESCRIPTION OF THE DRAWING FIGURES

Figure 2:
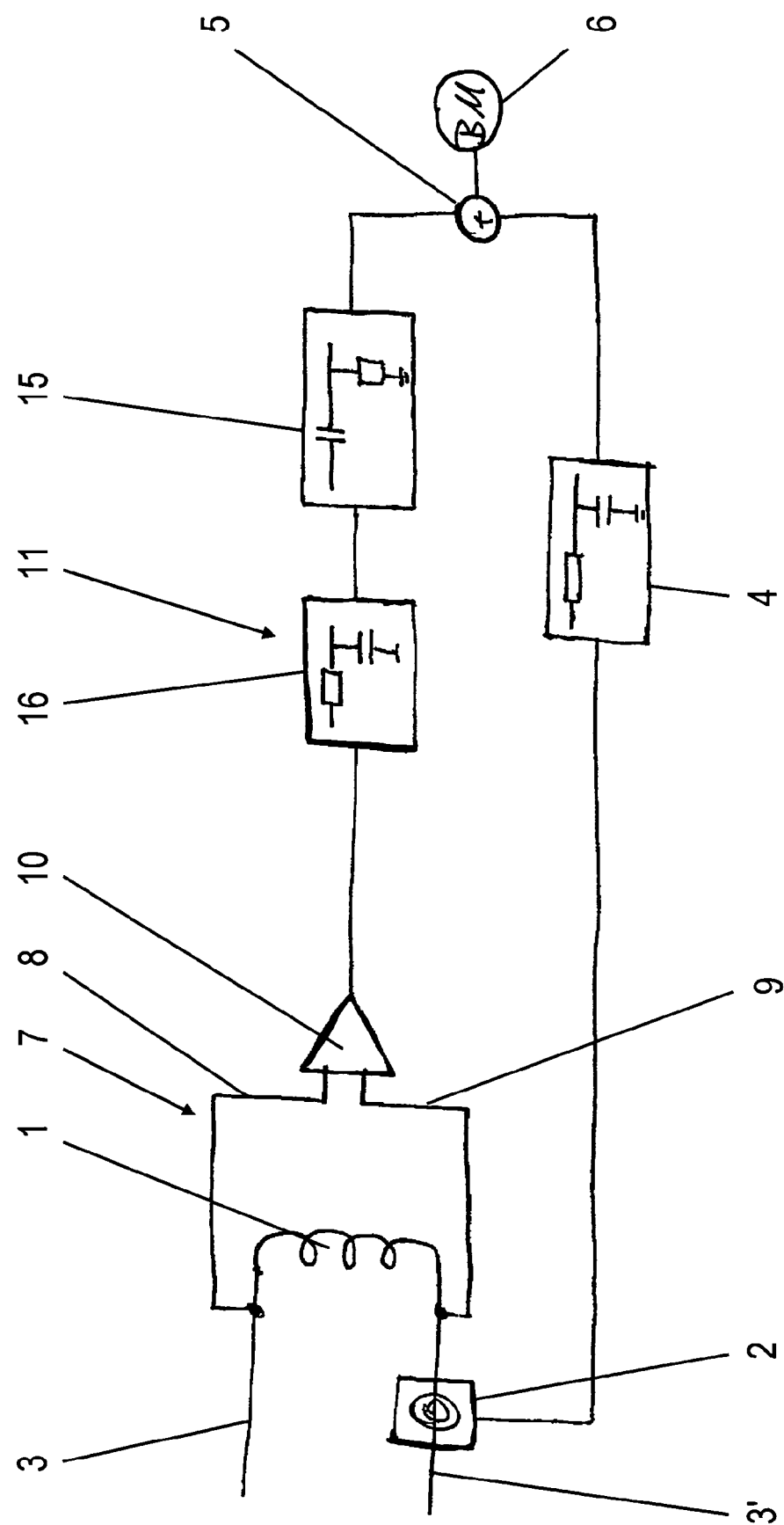
Figure 3:
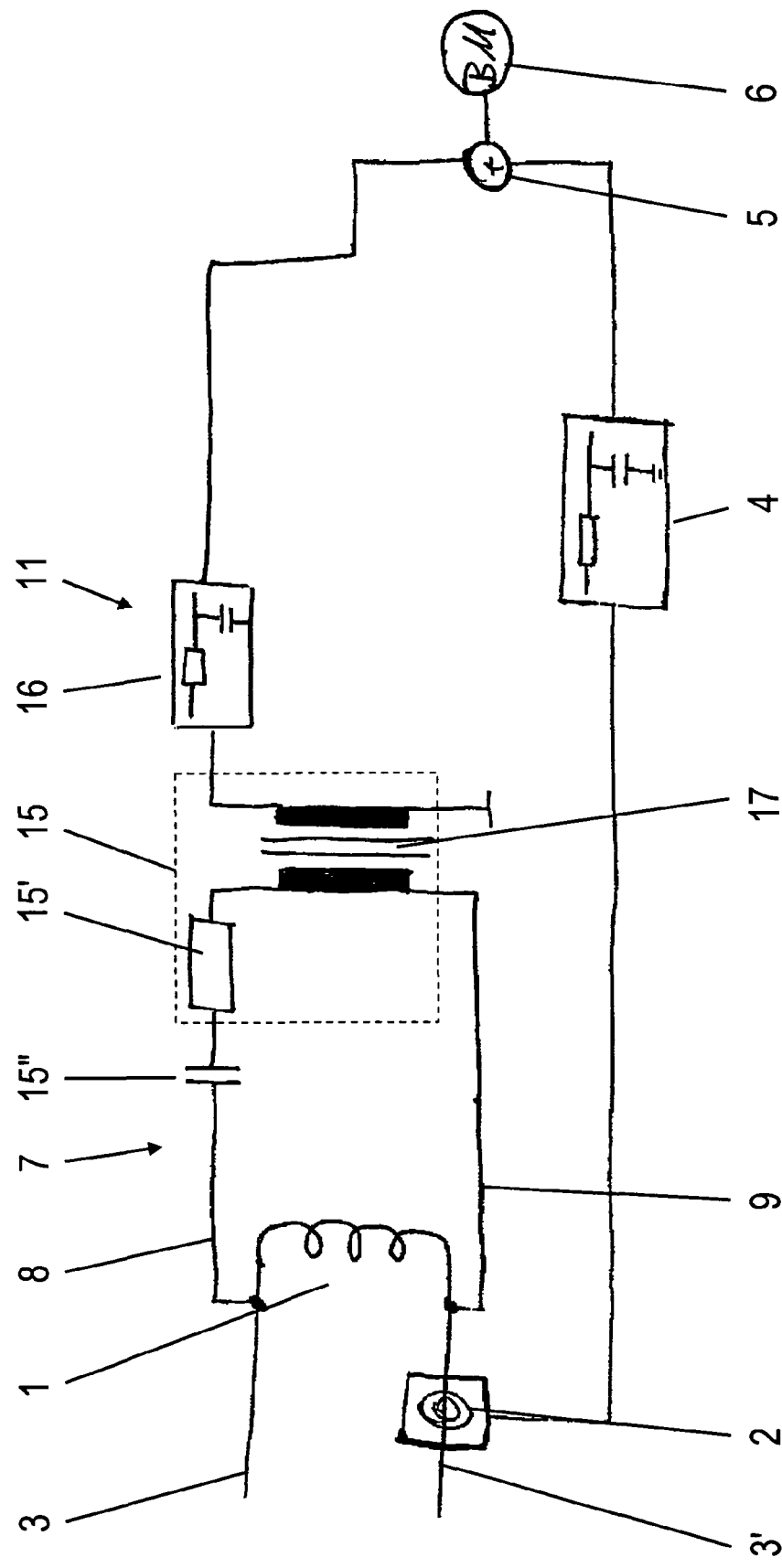
Figure 4:
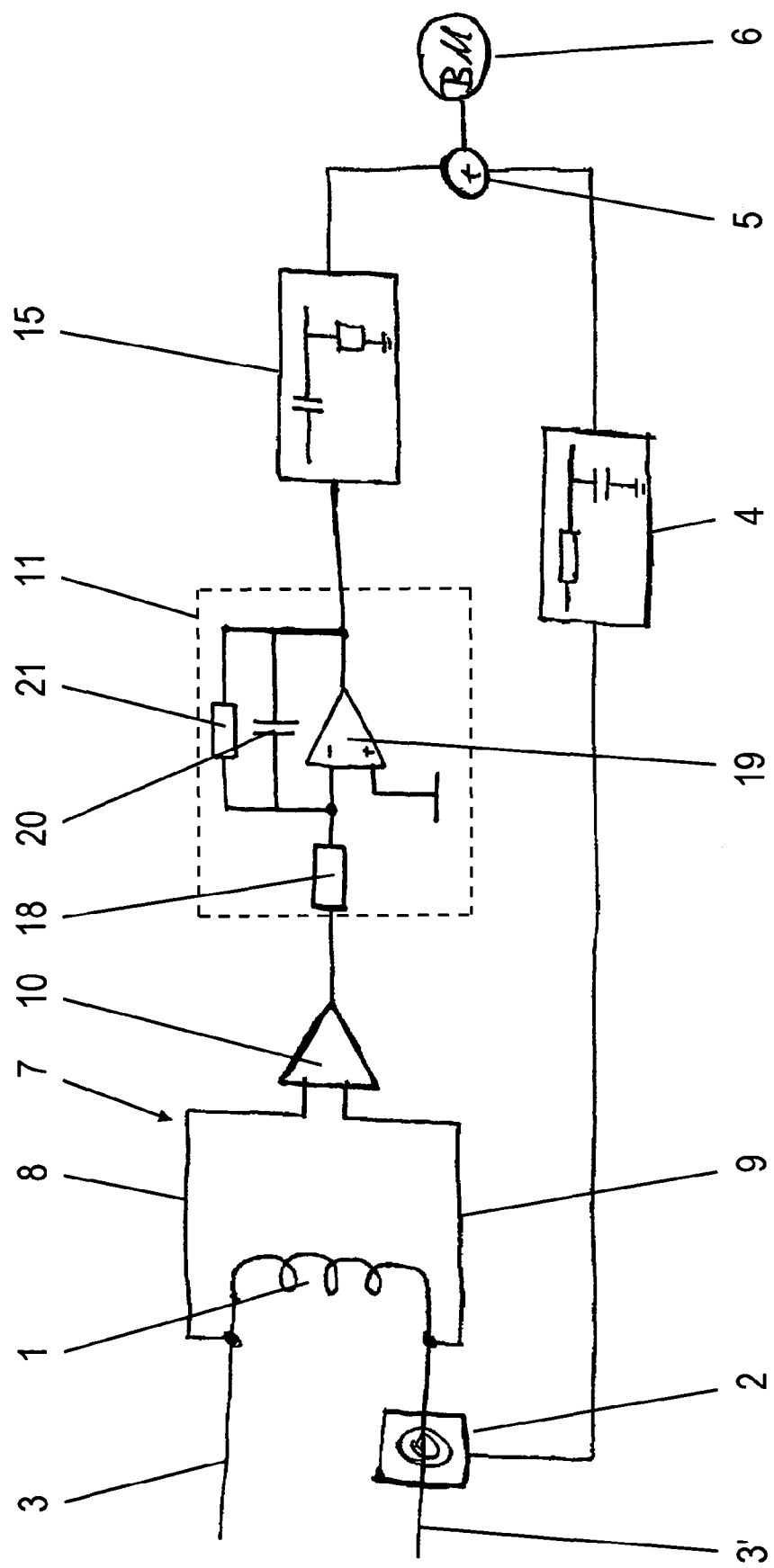
Figure 5:
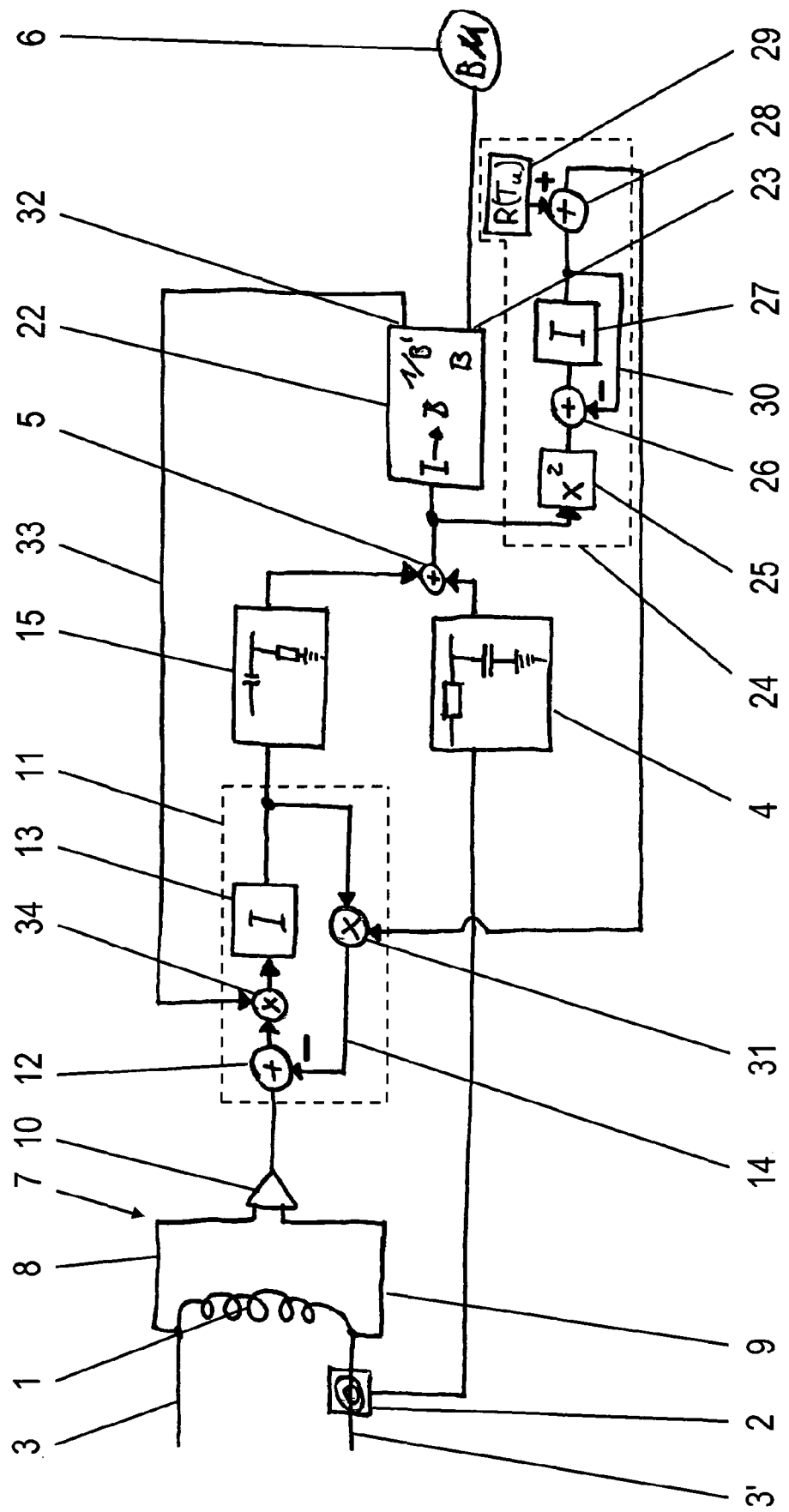
Figure 6:
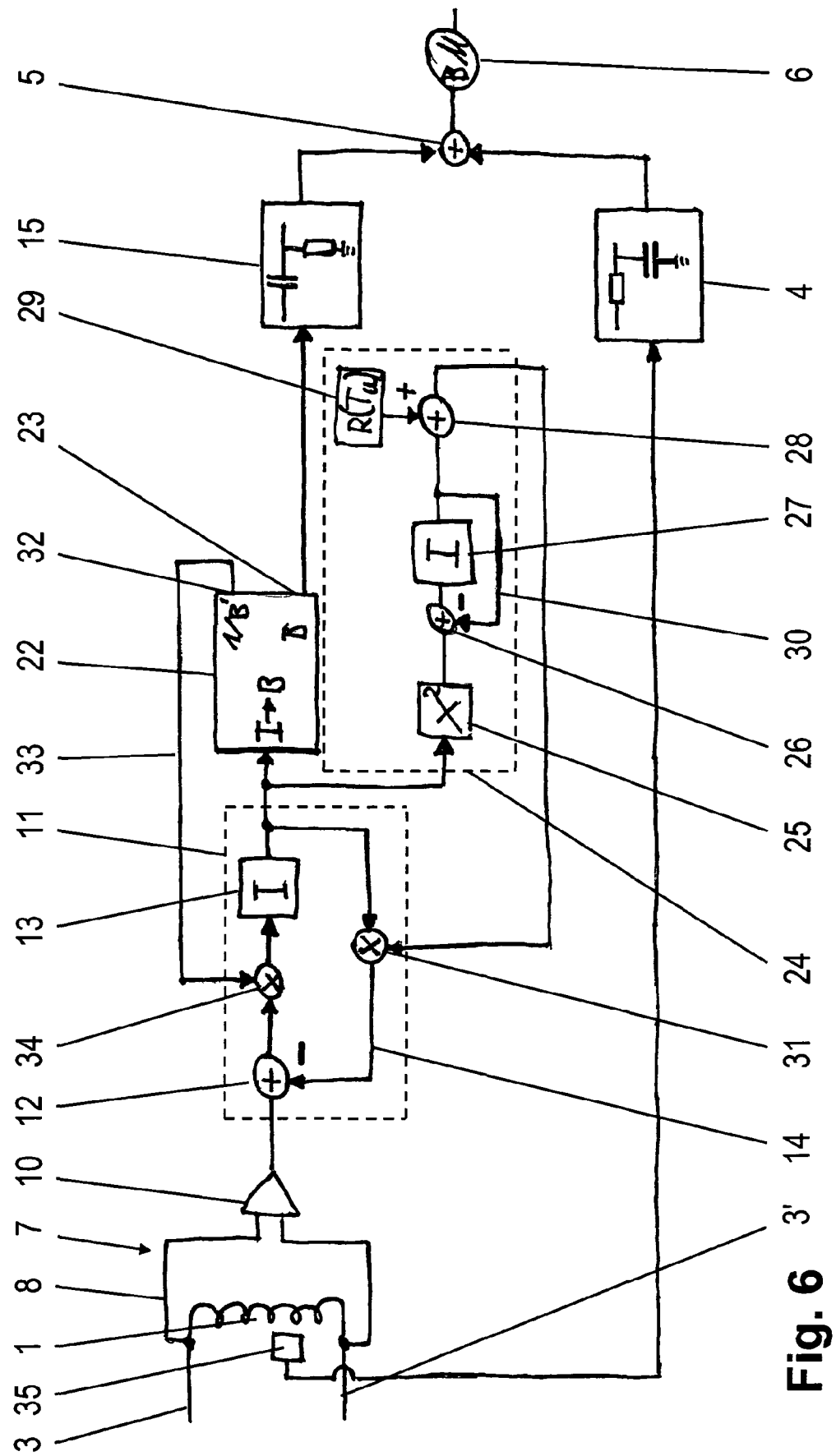

The present invention will be explained in the following text with reference to a drawing, which illustrates only preferred exemplary embodiments, and in which:

FIG. 1 shows a functional layout of a first exemplary embodiment of a device according to the invention for determination of the strength of the magnetic field of an electromagnet, FIG. 2 shows a first circuit layout according to the first exemplary embodiment, FIG. 3 shows a second circuit layout according to the first exemplary embodiment, FIG. 4 shows a third circuit layout according to the first exemplary embodiment, FIG. 5 shows a functional layout of a second exemplary embodiment with a temperature calculation circuit, and FIG. 6 shows a functional layout of a third exemplary embodiment with a temperature calculation circuit.

DETAILED DESCRIPTION OF THE PREFERRED EMBODIMENTS

FIG. 1 shows the functional layout of a first exemplary embodiment of a device according to the invention for determination of the magnetic field strength of an electromagnet 1, which is shown illustrated just in a schematic form. The functional layout of the device has a first branch in which a measurement device is provided in order to determine the magnetic field, with this, in this exemplary embodiment that is preferred to this extent, being a magnet current measurement device which is in the form of a DCCT (direct-current current transformer) 2. Alternatively, a magnetic field sensor can also be used, and is arranged around the supply lines 3, 3'. The coils of the DCCT 2 surround one of the supply lines 3, 3' of the electromagnet 1. The output of the DCCT 2 is connected to a low-pass filter 4, which is provided in the first branch. The output of the low-pass filter 4 is connected to an adder 5, whose output leads to a signal output 6 at which an output signal is emitted.

As the functional layout shown in FIG. 1 also shows, the device has a second branch, which has a voltage input 7 with two connections 8, 9, which are connected to the input of a differential amplifier 10. The connections 8, 9 are connected to the supply lines 3, 3' of the electromagnet 1 such that they record the voltage dropped across the electromagnet 1. The output from the differential amplifier 10 is connected to the input of a low-pass filter element 11, which comprises a low-pass filter element adder 12 with a first input, a second input and an output. A low-pass filter element integrator 13 is also provided, and is connected to the output of the low-pass filter element adder 12. The first input of the low-pass filter element adder 12 in this case forms the input of the low-pass filter element 11, and the output of the low-pass filter element integrator 13 forms the output of the low-pass filter element 11. In addition, a feedback connection 14 is provided and connects the output of the low-pass filter element integrator 13 to the second input of the low-pass filter element adder 12, with the output signal, supplied via the feedback connection 14, from the low-pass filter element integrator 13 being subtracted from the magnet voltage signal in the low-pass filter element adder 12, as is indicated by the minus sign. Negative feedback is therefore provided via the feedback connection 14. Finally, the time constant of the low-pass filter element integrator 13 is chosen appropriately in order to match the low-pass filter element 11 to the electromagnet 1. An arrangement such as this comprising an adder 12, integrator 13 and feedback connection 14 forms a first-order low-pass filter.

The low-pass filter element 11 is followed by a high-pass filter 15 whose output is connected to the adder 5. The high-pass filter 15 is used to pass only the high-frequency component of the second signal from the low-pass filter element 11 to the adder 5, and is matched to the low-pass filter 4 in the first branch.

In this case, in particular, the low-pass filter 4 is matched to the high-pass filter 15 such that components at a frequency which can pass through the high-pass filter 15 could no longer pass through the low-pass filter 4. The filter curves are complementary to one another, which means that the sum of the two filter transfer functions is constant over the entire frequency range under consideration. This can be achieved particularly easily by using a first-order low-pass filter and a first-order high-pass filter which both have the same cut-off frequency. In addition, the two branches must be matched to one another by appropriate frequency-independent gain factors.

The first exemplary embodiment of the device according to the invention, whose functional layout is illustrated in FIG. 1, operates as follows. Firstly, the current flowing through the electromagnet 1 in the first branch is measured by means of the DCCT 2, so that a first signal is recorded whose magnitude is a direct measure of the magnetic field strength of the electromagnet 1. The low-frequency components of the signal from the DCCT 2 can pass through the low-pass filter 4 and are therefore passed to the adder 5 and, via it, to the signal output 6. The optimum cut-off frequency of the low-pass filter 4 and the transition frequency depend on the operating conditions of the electromagnet 1 and the characteristic values of the measurement device. In this case, by way of example, the cut-off frequency may be between 5 Hz and 5 kHz.

In parallel with this, the voltage across the electromagnet 1 is recorded in the second branch via the connections 8, 9, and the differential amplifier 10 is used to produce a voltage signal which is proportional to this voltage. This voltage signal is passed to the low-pass filter element 11 which changes the magnet voltage signal such that the emitted second signal has approximately the same time profile as that of the magnetic field strength in the electromagnet 1 as well. This is done by integrating the voltage signal from the differential amplifier in the low-pass filter element integrator 13 over time, so that the integrated voltage signal is emitted at its output. This integrated signal is subtracted from the voltage signal from the differential amplifier 10 in the low-pass filter element adder 12, thus providing negative feedback.

The high-frequency components of the signal from the low-pass filter element 11 above the upper cut-off frequency are passed via the high-pass filter 15 to the adder 5 where they are combined with the low-frequency signal from the first branch to form an output signal. Signals based on rapid changes in the magnetic field strength are therefore passed via the second branch to the signal output 6, while those in the first branch are blocked by the low-pass filter 4.

The simulation of the magnet current or of the magnetic field in the electromagnet 1 provided in the second branch makes it possible to provide a low-pass filter 4 in the first branch and therefore to reduce the noise produced by the DCCT 2 and the disturbance signals produced at the signal output 6 such that the device according to the invention makes it possible to quickly detect even minor changes in the magnet current and therefore also changes in the field produced by the electromagnet 1, quickly.

This is particularly relevant for electromagnets used in accelerator installations. In order to keep the field of the magnets stable, the field must be measured as accurately as possible, with little noise. Furthermore, any change in the magnetic field should be detected as quickly as possible in order to prevent the beam from being defocused and being deflected to an unacceptably great extent, possibly resulting in damage.

A first alternative of the functional layout illustrated in FIG. 1 can be produced in the form of the circuit layout illustrated in FIG. 2. In this case, the low-pass filter element 11 is in the form of a low-pass filter 16 with a resistor and a capacitor. In this case, the cut-off frequency $\omega_G$ of the low-pass filter 16 is chosen such that the voltage signal emitted from the low-pass filter 16 corresponds to the time profile of the magnetic field strength in the magnet 1, which is obtained from the magnet voltage recorded by the connections 8, 9. The cut-off frequency $\omega_G$ of the low-pass filter 16 is therefore in particular matched to the inductance L and the resistance R of the electromagnet 1.

In this case, use is made of the fact that the transfer function of a first-order low-pass filter has approximately the same profile as the relationship between the current and the voltage of a resistance without any reactance, and of an inductance connected in series with it, so that a first-order low-pass filter represents a "model" of an electromagnet.

It is therefore possible to simulate the time profile of the magnetic field strength in the electromagnet 1 as a function of the recorded voltage by the low-pass filter 16 in the low-pass filter element 11, such that the output signal from the low-pass filter element 11 approximates the time profile of the current in the electromagnet 1. The current is once again approximately a measure of the strength of the magnetic field in the electromagnet 1.

The combination of the low-pass-filtered signal from the DCCT 2 and the high-pass-filtered signal from the low-pass filter 16 on the one hand makes use of the high accuracy and stability of the DCCT 2 in the low-frequency range, and the low noise of the low-pass-filtered voltage signal in the high-frequency range, on the other hand.

FIG. 3 shows a second alternative circuit layout in which, in contrast to the previous circuit layout, the high-pass filter 15 is connected upstream of the low-pass filter element 11 in order to simulate the time profile of the magnetic field strength. In this specific design, the high-pass filter 15 is formed by the resistor 15' in the voltage input 7 and the inductance of a transformer 17. In this embodiment, the galvanic isolation provided by the transformer 17 and the simultaneous formation of the difference voltage between the supply lines 3, 3' are advantageous. Since the transformer 17 intrinsically has a high-pass filter response, the sequence illustrated here comprising the low-pass filter element 11, which in this case is formed by the low-pass filter 16, and the high-pass filter 15 is necessary. If the input impedance of the low-pass filter element 11 is too low, it must be preceded by an amplifier with a high-impedance input. The capacitor 15'' in the voltage input 7 prevents any direct-current drive to the transformer 17 and therefore distortion resulting from saturation of the transformer 17 as well as unnecessary heating of the resistor 15' and transformer 17. Its capacitance must be chosen to be sufficiently great not to severely corrupt the transfer function of the high-pass filter 15 formed by the resistor 15' and the transformer 17.

A circuit layout of a further alternative for implementation of the first exemplary embodiment is illustrated in FIG. 4. As the measurement device in the first branch, this once again contains a DCCT 2 which is connected via the low-pass filter 4 to the adder 5 and to the signal output 6. In this circuit layout, the low-pass filter element 11 has a first resistor 18, an operational amplifier 19, a capacitor 20 and a second resistor 21. The first resistor 18 is connected to the inverting input of the operational amplifier 19, and the capacitor 20 is connected in parallel with the inverting input and the output of the operational amplifier 19. In addition, the second resistor 21 is connected in parallel with the capacitor 20 as well as the inverting input and the output of the operational amplifier 19. A low-pass filter element 11 configuration such as this can likewise be used to simulate the current/voltage behavior with a magnet, since this likewise represents a first-order low-pass filter.

FIG. 5 shows the functional layout of a second exemplary embodiment of a device according to the present invention.

In this case, as in the case of the first exemplary embodiment as well, the first branch has a DCCT 2 as the measurement device for determination of the magnetic field of the electromagnet 1. The signal from the DCCT 2 is once again passed via a low-pass filter 4 to an adder 5 but, in this exemplary embodiment, the adder 5 is followed by a temperature calculation circuit 24 which is used to take account of changes in the resistance of the electromagnet 1 as a result of current-flow-dependent temperature increases. Furthermore, the adder 5 is followed by a converter 22 which will be described in more detail in the following text and has an output 23 via which an output signal is emitted to the signal output 6.

As in the first exemplary embodiment as well, the second branch has a low-pass filter element 11, which comprises a low-pass filter element adder 12, a low-pass filter element integrator 13 and a feedback connection 14, downstream from the voltage input 7 and the differential amplifier 10, with this feedback connection 14 operating in the manner which has already been described. Once again, the low-pass filter element 11 is followed by a high-pass filter 15 whose output signal is passed to the adder 5. The output signal from the adder 5 is passed on the one hand to the converter 22 and on the other hand to the temperature calculation circuit 24.

The temperature calculation circuit 24 is connected via the high-pass filter 15 and the adder 5 downstream from the low-pass filter element integrator 13 and receives as its input signal the sum formed by the adder 5. It therefore also receives the signal from the first branch and has a squaring element 25, a feedback adder 26, an integrator 27 and a resistance adder 28. The feedback adder 26 is connected via its first input to the output of the squaring element 25 and via its output to the input of the integrator 27. The integrator 27 is followed by a resistance adder 28, which has a first input, a second input which is connected to the output of the integrator 27, and an output. A resistance source 29 is also provided and produces a voltage signal at the second input of the resistance adder 28. In addition, a feedback line 30 connects the output of the integrator 27 to the second input of the feedback adder 26.

In order to take account of the output signal from the temperature calculation circuit 24 in the simulation of the magnetic field strength, a multiplier 31 is provided in the feedback connection 14 of the low-pass filter element 11, and is connected to the output of the resistance adder 28 in the temperature calculation circuit 24.

The temperature calculation circuit 24 operates as follows. The heating of the electromagnet 1 is simulated by the integrator 27 to which the magnetic field strength signal, having been squared by the squaring element 25, from the low-pass filter element 11 is fed. This is based on the heating being proportional to the power and therefore proportional to the square of the current. It is also assumed that the increase in the resistance as a result of heating is proportional to the temperature increase. In order to finally produce a signal which is proportional to the total resistance of the electromagnet 1 at the output of the temperature calculation circuit 24, the resistance source 29 adds an additional signal to the resistance adder 28 to form the output signal of the integrator 27, which corresponds to the resistance of the electromagnet 1 at the environmental temperature. The output signal from the temperature calculation circuit 24, which is therefore a measure of the total resistance of the electromagnet 1, is multiplied by the output of the low-pass filter element integrator 13, that is to say by the magnet current signal (multiplier 31), in order in this way to obtain a measure of the voltage drop across the resistance, which is then subtracted from the signal of the total magnet voltage, at the low-pass filter element adder 12. After this subtraction, the low-pass filter element integrator 13 is therefore supplied only with the component of the magnet voltage which results from the inductance of the magnet. The output of the low-pass filter element 11 is therefore temperature-independent, with regard to the resistance of the electromagnet.

The negative feedback via the feedback line 30 and the feedback adder 26 are intended to take account of cooling of the electromagnet 1, for example caused by convection. The negative feedback takes account of the fact that the temperature rise turns out to be increasingly less, because of cooling, as the temperature rises, since the heat emitted is proportional to the temperature difference between the magnet 1 and the environment.

Furthermore, in the exemplary embodiment shown in FIG. 5, a converter 22 is provided downstream from the adder 5 and converts the incoming magnet current signal from the two branches to a voltage signal which is proportional to the magnetic field strength of the electromagnet 1, with this output signal being emitted at the output 23 and being passed to the signal output 6. In this case, in this preferred exemplary embodiment, the converter 22 is used to store a table which assigns an appropriate magnetic field strength value to each value of the magnet current signal. In this way, saturation effects in the electromagnet 1 are taken into account in this exemplary embodiment of a device according to the invention, as a consequence of which any rise in the magnet current leads to a magnetic field strength increase which becomes ever less as the magnet current increases.

The converter 22 also has an output 32 at which a voltage supply is emitted which is proportional to the reciprocal of the derivative of the magnetic field strength as a function of the magnet current. This is passed via the connection 33 to a multiplier 34 which is connected between the low-pass filter element adder 12 and the low-pass filter element integrator 13.

This makes it possible to also take account of saturation effects relating to the change in the magnet current value as a function of the change in the magnet voltage. The change in the inductance of the electromagnet 1 resulting from saturation effects is then already included in the incoming magnet voltage signal.

In addition, hysteresis effects in the electromagnet 1 can be taken into account in the converter 22 for the output of the magnetic field strength value by carrying out a further correction process, which depends inter alia on the direction of the current change, as well as using the table which is stored in the converter 22.

The functional layout of a third exemplary embodiment of a device according to the invention as illustrated in FIG. 6 differs from that illustrated in FIG. 5 in that, instead of a DCCT, a Hall probe 35 is provided in order to directly measure the magnetic field of the electromagnet 1. Since the magnetic field is recorded directly in the first branch, there is no need to supply the signal from the first branch to the converter 22 as well. In consequence, in this exemplary embodiment, both the converter 22 and the temperature calculation circuit 24 are arranged only in the second branch.

In this case, the temperature calculation circuit 24 is connected directly downstream from the low-pass filter element integrator 13, but its design corresponds to that of the second exemplary embodiment. A squaring element 25, a feedback adder 26, an integrator 27, a resistance adder 28, a resistance source 29 and a feedback line 30 are likewise provided. In addition, in this example as well, the output signal from the temperature calculation circuit 24 is injected via the multiplier 31 into the low-pass filter element 11 so that this results in the method of operation that has already been described in conjunction with FIG. 5.

In this example, the converter 22 is provided in the second branch and is designed in precisely the same way as that described in conjunction with FIG. 4, and has an output 23 for the magnetic field strength signal, and a derivative output 32.

The magnetic field strength signal from the converter 22 is passed via the high-pass filter 15 to the adder, where it is combined with the magnetic field strength signal from the second branch from the Hall probe 35 and the low-pass filter 4, and is passed as an output signal to the signal output 6.

In addition to the advantage that the "simulated signal" from the low-pass filter element 11 has considerably less noise than the measurement device in the second branch, the second and third exemplary embodiments take account of temperature effects in the electromagnet 1 as well as saturation effects and, possibly, hysteresis effects.

The exemplary embodiments all have the common factor that the adders 5, 12, 26, 28, multipliers 31, 34, integrators 13, 27, low-pass filters 4, 16, high-pass filters 15, differential amplifier 10 and operational amplifier 19 contained in the functional layouts as described above are conventional electrical components or assemblies which do not need to be specifically adapted in order to carry out the invention. All that may be necessary is to choose certain parameters such as time constants as a function of the parameters of the electromagnet 1.

Overall, the present invention allows quick detection of even minor discrepancies between the measured magnetic field strength value and a nominal value. This is particularly relevant for automatic control and monitoring of magnets in accelerator installations.

The invention claimed is:

1. A device for determining the magnetic field strength of an electromagnet which includes a first supply line and a second supply line, said apparatus comprising:
   a measurement device for determining the magnetic field of the electromagnet;
   a low-pass filter element connected to the first supply line and to the second supply line and operable to emit a signal at an output of the low-pass filter element from voltage between the first supply line and the second supply line, wherein said signal approximates to a time profile of the magnetic field strength in the electromagnet;
   a low-pass filter downstream from the measurement device;
   a high-pass filter connected in series with the low-pass filter element; and
   a signal output,
   said measurement device including an output,
   said output of the measurement device and the output of the low-pass filter element being connected to the signal output.

2. The device as claimed in claim 1,
   said low-pass filter element comprising:
   a low-pass filter element adder with a first input, a second input and an output;
   a low-pass filter element integrator connected to the output of the low-pass filter element adder; and
   a feedback connection,
   said first input of the low-pass filter element adder forming an input of the low-pass filter element,
   said low-pass filter element integrator including an output that forms the output of the low-pass filter element,
   said feedback connection connecting the output of the low-pass filter element integrator to the second input of the low-pass filter element adder.

3. The device as claimed in claim 2; and
   a temperature calculation circuit to take account of temperature changes in the electromagnet,
   said temperature calculation circuit being connected to the low-pass filter element.

4. The device as claimed in claim 3,
   said temperature calculation circuit comprising:
   a squaring element including an output;
   a feedback adder connected via a first input to the output of the squaring element;
   an integrator including an input that is connected to the output of the feedback adder and including an integrator output;
   a feedback line connecting the output of the integrator to a second input of the feedback adder;
   a resistance adder including a first input, a second input connected to the output of the integrator, and an output; and
   a resistance source passing a voltage signal to the second input of the resistance adder, said feedback connection of the low-pass filter element including a multiplier,
said output of the resistance adder being connected to the multiplier.

5. The device as claimed in claim 2; and
a converter connected to the output of the low-pass filter element and adapted to emit a signal proportional to the magnetic field strength in the electromagnet.

6. The device as claimed in claim 5,
said converter having a derivative output producing a signal that is proportional to the reciprocal of the derivative of the magnetic field strength in the electromagnet as a function of the current; and
a multiplier between the low-pass filter element adder and the low-pass filter element integrator,
said multiplier including a first input connected to the low-pass filter element adder and including an output connected to the low-pass filter element integrator,
said derivative output being connected to a second input of the multiplier.

7. The device as claimed in claim 1,
said low-pass filter element comprising a low-pass filter with a resistor and a capacitor and a cut-off frequency is matched to the inductance and the resistance of the electromagnet.

8. The device as claimed in claim 1,
said low-pass filter element comprising:
a first resistor;
an operational amplifier;
a capacitor; and
a second resistor,
said first resistor being connected to an inverting input of the operational amplifier,
said capacitor being connected in parallel with the inverting input and the output of the operational amplifier,
said second resistor being connected in parallel with the capacitor and the inverting input and the output of the operational amplifier.

9. The device as claimed in claim 1,
said measurement device comprising a magnetic field strength measurement device.

10. The device as claimed in claim 9,
said magnetic field measurement device comprising a Hall probe.

11. The device as claimed in claim 1,
said measurement device comprising a magnet current measurement device.

12. The apparatus as claimed in claim 1; and
a temperature calculation circuit to take account of temperature changes in the electromagnet,
said temperature calculation circuit being connected to the low-pass filter element.

13. A method for determining the strength of the magnetic field of an electromagnet, said method comprising the steps:
recording a first signal whose magnitude is a direct measure of the magnetic field strength of the electromagnet;
recording the voltage dropped across the electromagnet;
producing a second signal from the recorded voltage, with the recorded voltage being low-pass-filtered such that the time profile of the second signal is approximated to that of the magnetic field strength in the electromagnet;
combining the first signal and the second signal to form an output signal; and
filtering the first signal and the second signal such that only low-frequency components of the first signal and only high-frequency components of the second signal are included in the output signal.

14. The method as claimed in claim 13,
said low-pass filtering of the producing step including the steps of integrating the recorded voltage and subtracting the integrated signal from the recorded voltage before integration.

15. The method as claimed in claim 13,
said recording of the first signal including the step of measuring the magnet current level.

16. The method as claimed in claim 13,
said recording of the first signal including the step of measuring the magnetic field strength.

17. The method as claimed in claim 13,
said producing of the second signal including the step of accounting for temperature increase of the electromagnet.

18. The method as claimed in claim 13; and
converting the second signal to a signal proportional to the magnetic field strength, and compensating for saturation effects.

19. The method as claimed in claim 13; and
converting the second signal to a signal proportional to the magnetic field strength, and compensating for hysteresis effects.

20. The method as claimed in claim 13; and
converting the second signal to a signal proportional to the magnetic field strength, and compensating for saturation and hysteresis effects.

* * * * *